(12) United States Patent
Sasaki et al.

(10) Patent No.: US 10,379,307 B2
(45) Date of Patent: Aug. 13, 2019

(54) OPTICAL-ELECTRICAL COMPOSITE CABLE

(71) Applicants: SMK Corporation, Tokyo (JP); TOMOEGAWA CO., LTD., Tokyo (JP)

(72) Inventors: Tadahito Sasaki, Kanagawa (JP); Kohei Homma, Tokyo (JP); Mitsuhiro Yoshida, Kanagawa (JP); Masayoshi Suzuki, Shizuoka (JP); Makoto Goto, Shizuoka (JP)

(73) Assignee: SMK Corporation, Tokyo (JP)

( * ) Notice: Subject to any disclaimer, the term of this patent is extended or adjusted under 35 U.S.C. 154(b) by 0 days.

(21) Appl. No.: 16/043,178

(22) Filed: Jul. 24, 2018

(65) Prior Publication Data

US 2019/0033544 A1     Jan. 31, 2019

(30) Foreign Application Priority Data

Jul. 28, 2017   (JP) .................................. 2017-145950

(51) Int. Cl.
*B32B 15/088* (2006.01)
*B32B 27/34* (2006.01)
(Continued)

(52) U.S. Cl.
CPC .......... *G02B 6/4415* (2013.01); *B32B 15/088* (2013.01); *B32B 27/34* (2013.01);
(Continued)

(58) Field of Classification Search
CPC .... G02B 6/4403; G02B 6/4404; G02B 6/448; G02B 6/4416; G02B 6/4415;
(Continued)

(56) References Cited

U.S. PATENT DOCUMENTS 4,468,089 A * 8/1984 Brorein ................ G02B 6/4403
156/53
4,741,594 A * 5/1988 Suzuki ................ G02B 6/4403
385/115

(Continued)

FOREIGN PATENT DOCUMENTS

JP      S5128483 U    3/1976
JP      H09145969 A   6/1997
(Continued)

OTHER PUBLICATIONS

Office Action issued for counterpart Japanese Application 2017-145950, issued by the Japan Patent Office on Jan. 30, 2018.

*Primary Examiner* — Andargie M Aychillhum
*Assistant Examiner* — Michael F McAllister

(57) ABSTRACT

Provided is an optical-electrical composite cable in which, even if the entire optical-electrical composite cable having an optical fiber routed along flexible flat wiring boards is made thin, the optical fiber is not deformed or damaged by a large bending stress. A pair of the flexible flat wiring boards are disposed on a front surface side and a rear surface side of the optical fiber, and a covering member integrates the entirety thereof. Thus, even if the optical-electrical composite cable is made thin, the cable is not bent with a large curvature without deformation of the optical fiber.

5 Claims, 11 Drawing Sheets

(51) Int. Cl.
  *G02B 6/43* (2006.01)
  *H01B 7/08* (2006.01)
  *G02B 6/44* (2006.01)
  *G02B 6/38* (2006.01)
  *H05K 1/02* (2006.01)
  *G02B 6/42* (2006.01)
  *H05K 1/18* (2006.01)

(52) U.S. Cl.
  CPC ............ *G02B 6/3817* (2013.01); *G02B 6/428* (2013.01); *G02B 6/43* (2013.01); *H01B 7/08* (2013.01); *H05K 1/0274* (2013.01); *H05K 1/189* (2013.01); *H05K 2201/10121* (2013.01)

(58) Field of Classification Search
  CPC ........ G02B 6/3817; G02B 6/428; G02B 6/43; G02B 5/16; H01B 7/0838; H01B 7/0823; H01B 11/00; B32B 15/088; B32B 27/34; H05K 1/0274; H05K 1/189; H05K 2201/10121
  USPC .............. 174/70 R, 74, 117 R, 117 F, 36, 32
  See application file for complete search history.

(56) References Cited

U.S. PATENT DOCUMENTS

| | | | | |
|---|---|---|---|---|
| 4,906,067 | A * | 3/1990 | Mayr | G02B 6/441 385/112 |
| 6,107,577 | A * | 8/2000 | Sexton | G02B 6/4403 174/117 A |
| 6,434,305 | B1 * | 8/2002 | Lochkovic | G02B 6/4404 385/114 |
| 6,969,807 | B1 * | 11/2005 | Lin | H01B 7/0861 174/117 F |
| 9,477,038 | B2 * | 10/2016 | Yu | G02B 6/12 |
| 2006/0192278 | A1 * | 8/2006 | Furuyama | G02B 6/43 257/686 |
| 2011/0052205 | A1 * | 3/2011 | Yu | H04B 10/801 398/142 |
| 2011/0293226 | A1 | 12/2011 | Yasuda et al. | |
| 2012/0207438 | A1 * | 8/2012 | Yu | G02B 6/43 385/101 |
| 2014/0262430 | A1 * | 9/2014 | Yamada | H01B 3/443 174/117 F |

FOREIGN PATENT DOCUMENTS

| | | |
|---|---|---|
| JP | 2010019895 A | 1/2010 |
| JP | 2012089315 A | 5/2012 |
| JP | 5180856 B2 | 4/2013 |

* cited by examiner

OPTICAL-ELECTRICAL COMPOSITE CABLE

CROSS REFERENCE TO RELATED APPLICATION

The contents of the following Japanese patent application are incorporated herein by reference,
Japanese Patent Application No. 2017-145950 filed on Jul. 28, 2017.

FIELD

The present invention relates to an optical-electrical composite cable connected to slim panel-shaped electrical equipment, and more specifically relates to an optical-electrical composite cable in which flexible flat wiring boards and an optical fiber are combined.

BACKGROUND

As slim panel-shaped electrical equipment, for example, there is a display device 101 of a wall-mounted television 110 arranged along a wall surface. The display device 101 has a structure and a configuration as shown in FIGS. 7 and 8, such that the display device 101 does not protrude largely from the wall surface. An additional device 102, which has a communication control unit 102b configured to process a video signal to be displayed on the display device 101 and a power supply unit 102a for the display device 101, is disposed in an embedded box SB that is embedded in a wall panel WP. While driving power is fed from the additional device 102 to the display device 101 through a power line 103 connected to a rear surface of the display device 101, electrical signals including the video signal and the like are outputted to the display device 101 through signal lines 104 (Patent Literature 1).

Such a wall-mounted television 110 attached to the wall surface requires boring holes in the wall panel WP for the purpose of containing the additional device 102 in the embedded box SB in the wall panel WP, and therefore the wall panel WP requires machining. Since the holes limit the position of attachment, the wall-mounted television 110 is difficult to move to a desired position. Therefore, a set top box STB that outputs video signals and control signals to the display device is separated from the display device, and the set top box STB and the display device are connected with a connection cable, in order to slim the display device, i.e. slim panel-shaped electrical equipment. This also allows the display device to be disposed in an arbitrary position.

To connect the connection cable to the wall-mounted television 110 attached to the wall surface without boring holes, a terminal of the connection cable is required to be inserted into and connected to a connection slot provided on a side surface of the wall-mounted television 110 having a width of less than 1 cm. As the connection cable for this application, a flexible flat wiring board such as a flexible printed circuit (FPC) or a flexible flat cable (FFC) is used.

Furthermore, in association with an increase in the size of the display device, larger video signals are required to be transmitted at higher speed from the set top box to the display device. In this process, electrical signal lines formed in the flexible flat wiring board have transmission limitations. Therefore, optical-electrical composite cables in which an optical waveguide made of an optical fiber is formed along a flexible flat wiring board to transmit a large signal at a high speed through the optical waveguide are reported (Patent Literatures 2 and 3).

An optical-electrical composite cable 120 disclosed in Patent Literature 2 has a structure as shown in FIGS. 9A and 9B. In the optical-electrical composite cable 120, an optical fiber 123, which constitutes an optical waveguide, is disposed in parallel in the middle of a flexible flat cable in which a plurality of strip conductors 122, which function as electrical signal lines, are disposed in parallel in a surface of a slender strip-shaped insulating film base material 121a. The entire surface is covered with a thin insulating protective sheet 121b. Paired photoelectric conversion elements are provided at respective ends of the optical fiber 123, to apply an E/O conversion to a high-speed electrical signal, and to apply an O/E conversion to an optical signal. A large high-speed electrical signal is outputted through the optical fiber 123 to slim panel-shaped electrical equipment connected to a terminal of the optical-electrical composite cable 120, while relatively low-speed electrical signals are outputted thereto through the strip conductors 122 of the optical-electrical composite cable 120.

An optical-electrical composite cable 130 according to Patent Literature 3 has a structure as shown in FIGS. 10A and 10B. In the optical-electrical composite cable 130, a recessed groove 134 to contain an optical fiber 133 therein is formed in a slender strip-shaped flexible printed circuit 131 at a side of a wiring pattern functioning as signal lines. The optical fiber 133 is bridged across the recessed groove 134, to form the optical-electrical composite cable 130 into which the wiring pattern 132 and the optical fiber 133 are integrated. Paired photoelectric conversion elements 135 and 135 are mounted on the flexible printed circuit 131 at respective sides of the recessed groove 134, to apply an E/O conversion to a high-speed electrical signal, and to apply an O/E conversion to an optical signal. A large high-speed electrical signal is outputted through the optical fiber 133 to slim panel-shaped electrical equipment connected to a terminal of the optical-electrical composite cable 130, while a relatively low-speed electrical signal is outputted thereto through the wiring pattern of the optical-electrical composite cable 130.

CITATION LIST

Patent Literature

Patent Literature 1: Japanese Patent No. 5180856
Patent Literature 2: Japanese Patent Application Laid-Open No. 2011-248119
Patent Literature 3: Japanese Patent Application Laid-Open No. 2010-19895

SUMMARY

Technical Problem

As described above, to connect a terminal of a connection cable to a narrow side surface of slim panel-shaped electrical equipment, the connection cable has to be made from a thin flexible flat wiring board, such as a thin flexible printed circuit or a flexible flat cable. Furthermore, to output a large high-speed electrical signal to the electrical equipment, the optical-electrical composite cable 120 or 130 in which the optical fiber 123 or 133 is integrated into the flexible flat wiring board is used. On the other hand, in recent years, display devices used as wall-mounted televisions and the like are slimmed to a thickness of 3 mm or less, using organic EL display elements. Thus, a protrusion thickness from a wall surface is required to be 3 mm or less, including cables connected to the display device. In this case, since the thickness of the optical-electrical composite cable 120 or 130 connected to the side surface of the display device becomes 3 mm or less, the optical-electrical composite cable 120 or 130 is easily bent.

As a result, in the optical-electrical composite cable 120 shown in FIGS. 9A and 9B, the optical fiber 123 is secured on the surface of the insulating film material 121*a*, and the surface of the optical fiber 123 is covered only with the thin insulating protective sheet 121*b*. Accordingly, there is a problem that the insulating film material 121*a* that is bent to the side of the surface with a large curvature causes a damage or a break of the optical fiber 123.

In the optical-electrical composite cable 130 shown in FIGS. 10A and 10B, the optical fiber 133 is bridged across both ends of the recessed groove 134 with play, and only the both ends are supported by the flexible printed circuit 131. Accordingly, even if the flexible printed circuit 131 itself is largely distorted, the optical fiber 133 is not largely distorted together with the flexible printed circuit 131. However, a large bending stress is applied to securing ends at the both ends of the optical fiber 133. This does not result in a fundamental measures for protection of the optical fiber 133.

The flexible flat wiring board for the optical-electrical composite cable is required to have a power line for feeding power to the electrical equipment, in addition to having various types of signal lines corresponding to various types of signals to be outputted to the electrical equipment. At this time, insulating all of the signal lines and the power line from each other causes an increase in the width of the flexible flat wiring board. Accordingly, the flexible flat wiring board connected between the set top box STB and the display device in a room becomes conspicuous, thus impairing its appearance.

In particular, the power line formed in the flexible flat wiring board is thin. Thus, when an allowable current is set at 10 A to 20 A, which is equal to or more than a power current to operate the electrical equipment, a power pattern itself has to be wide. Furthermore, since the slim electrical equipment having a thickness of 3 mm or less cannot contain constant-voltage power circuit components having certain outside thicknesses, such as an operational amplifier, a three-terminal regulator, and the like, many power lines having different widths are routed in a state of being insulated from each other in accordance with consumption currents of individual circuit elements that operate with different power levels in the electrical equipment, and therefore, the flexible flat wiring board has to be designed wider.

Considering the problems as described above, the present invention aims at providing an optical-electrical composite cable in which an optical fiber is routed along a flexible flat wiring board, and, even if the entire optical-electrical composite cable is made thin, the optical fiber is not deformed or damaged by a large bending stress.

Another object is to provide an optical-electrical composite cable that, even if various types of signal lines and a power line are disposed in a flexible flat wiring board, the lateral width of the optical-electrical composite cable in a direction orthogonal to a routing direction does not increase.

Solution to Problem

To achieve the above-described objects, an optical-electrical composite cable according to a first aspect is connected to slim panel-shaped electrical equipment. In the optical-electrical composite cable, flexible flat wiring boards having signal lines to output electrical signals to the electrical equipment and an optical fiber to output an optical signal to be converted into a high-speed electrical signal to the electrical equipment are combined. The optical-electrical composite cable includes the optical fiber; at least one pair of the flexible flat wiring boards in which flat wiring boards composed of flexible flat cables having a plurality of straight strip-shaped conductors secured along a slender strip-shaped film base material or flexible printed circuits having a power line and a signal line routed in a longitudinal direction of a slender strip-shaped flexible base material are laminated along the optical fiber on a front surface side and a rear surface side of the optical fiber; and a covering member configured to integrate an entirety of the pair of flexible flat wiring boards and the optical fiber.

Since the optical fiber is integrated by the covering member in a state of being sandwiched between the pair of flexible flat wiring boards laminated on the front surface side and the rear surface side of the optical fiber, the optical fiber does not distort on the front surface side or the rear surface side with a large curvature.

Since the signal line can be disposed in each of the pair of flexible flat wiring boards laminated in a thickness direction, a lot of types of signal lines can be disposed, without increasing the width of the optical-electrical composite cable.

The entirety of the pair of flexible flat wiring boards having the signal lines for outputting low-speed electrical signals to the electrical equipment and the optical fiber for outputting an optical signal to be converted into a high-speed electrical signal to the electrical equipment can be integrated thinly to a thickness of several mm or less. A terminal portion of the thin optical-electrical composite cable is inserted into a narrow side surface of the slim panel-shaped electrical equipment, to output the low-speed signal and the optical signal to be converted into the high-speed electrical signal to the electrical equipment.

In the optical-electrical composite cable according to a second aspect, the covering member tightly adheres to the outer peripheries of the pair of flexible flat wiring boards, and the covering member integrates the entirety of the pair of flexible flat wiring boards sandwiching the optical fiber.

The pair of flexible flat wiring boards are covered with the covering member that adheres to the outer peripheries thereof.

In the optical-electrical composite cable according to a third aspect, each of the pair of flexible flat wiring boards is a flexible flat cable.

Since the pair of flexible flat wiring boards are composed of the flexible flat cables, the optical-electrical composite cable that is long to the extent of several meters can be manufactured inexpensively.

Since a strip-shaped conductive metal thin plate secured on an insulating flexible flat substrate of the flexible flat cable is used as the signal line, the signal line is folded back by 180 degrees, while keeping the flexible flat cable in a flat state, in order to change a routing direction of the signal line to a predetermined direction.

In the optical-electrical composite cable according to a fourth aspect, an intermediate flexible flat wiring board is disposed at a side of the optical fiber sandwiched between the pair of flexible flat wiring boards disposed on the front surface side and the rear surface side. The covering member integrates the entirety of the pair of flexible flat wiring boards, the optical fiber, and the intermediate flexible flat wiring board.

Even if a more number of types of signal lines are disposed in the intermediate flexible flat wiring board, the thickness and width of the optical-electrical composite cable does not change.

In the optical-electrical composite cable according to a fifth aspect, a power line for feeding driving power to drive the electrical equipment is disposed in at least any of the pair of flexible flat wiring boards.

Since the power line can be disposed in at least any of the pair of flexible flat wiring boards having an adequate width, the line width of the power line can be increased in cross-sectional area, and therefore an allowable current of the power line can be increased.

In the optical-electrical composite cable according to a sixth aspect, the covering member is made of a synthetic rubber.

The pair of flexible flat wiring boards and the optical fiber are enclosed by the synthetic rubber having elasticity, and therefore the synthetic rubber attenuates an impact from outside.

According to the invention of the first aspect, since the optical fiber is protected by the pair of flexible flat wiring boards laminated on the front surface side and the rear surface side of the optical fiber, the optical fiber is not distorted largely. Therefore, the optical fiber is prevented from being deformed or damaged.

In the narrow side surface of the slim panel-shaped electrical equipment, the signal lines and the optical fiber, for outputting the electrical signals to the electrical equipment, can be connected collectively.

Since the many signal lines for outputting the electrical signals are collectively integrated with the optical fiber, without an increase in width, if the optical-electrical composite cable is routed in a room, the optical-electrical composite cable does not impair visual beauty. Furthermore, users are not likely to divide the individual flexible flat wiring boards and the optical fiber, and wrongly connect the flexible flat wiring boards and the optical fiber to the electrical equipment.

According to the invention of the second aspect, the pair of flexible flat wiring boards are protected by the covering member.

According to the invention of the third aspect, each of the pair of flexible flat wiring boards of the optical-electrical composite cable is composed of a flexible flat cable that is manufactured only by securing strip-shaped conductive metal thin plates on an insulating flexible flat substrate. Therefore, the optical-electrical composite cable can be long to the extent of several meters, and can be manufactured at a low cost per unit of length.

In the narrow side surface of the slim panel-shaped electrical equipment, the flexible flat cable can be folded back by 180 degrees, while keeping the flexible flat cable in a flat state, in order to draw out the signal lines to an arbitrary direction that does not overlap with an extending direction of the optical fiber.

According to the invention of the fourth aspect, a more number of signal lines can be routed without changing the thickness and width of the optical-electrical composite cable.

According to the invention of the fifth aspect, even if the power line is wide enough to pass a large allowable current, the power line can be formed in any of the flexible flat wiring boards.

Since the optical-electrical composite cable can collectively connect the power line for feeding the driving power to the electrical equipment, the signal lines for outputting the low-speed electrical signals to the electrical equipment, and the optical fiber for outputting the high-speed electrical signal to the electrical equipment to the narrow side surface of the slim panel-shaped electrical equipment, it is possible to eliminate the need for connecting another separate power cable to feed driving power to the electrical equipment.

According to the invention of the sixth aspect, since the peripheries of the pair of flexible flat wiring boards and the optical fiber are enclosed with the synthetic rubber having elasticity, even if an unexpected load or shock is applied to the optical-electrical composite cable from outside, the pair of flexible flat wiring boards and the optical fiber are prevented from being broken or damaged.

DESCRIPTION OF EMBODIMENTS

Figure 1:
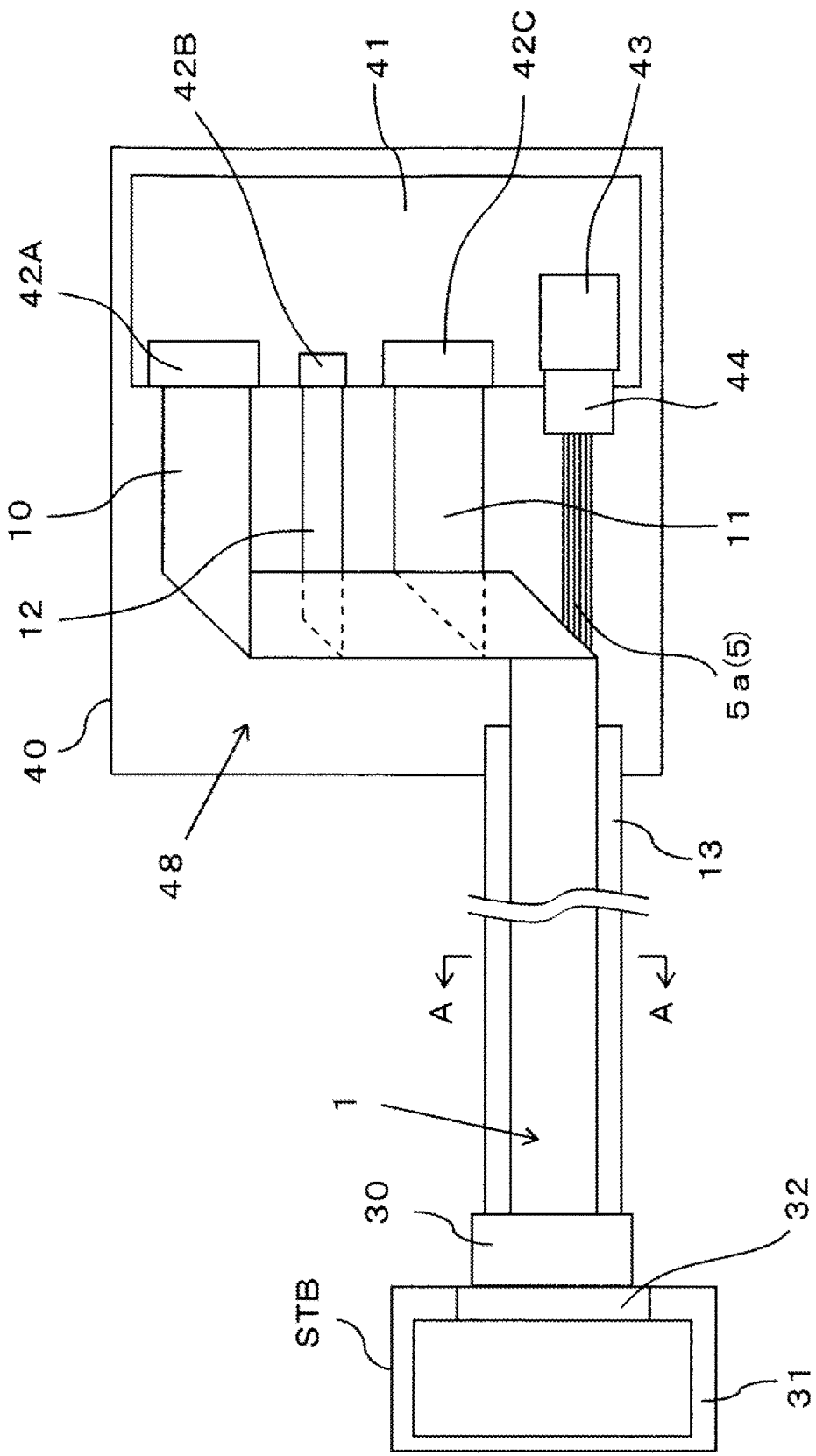
FIG. 1 is a plan view of an optical-electrical composite cable 1 to connect between a flat display device 40 and a set top box STB, according to an embodiment of the present invention.
Figure 2:
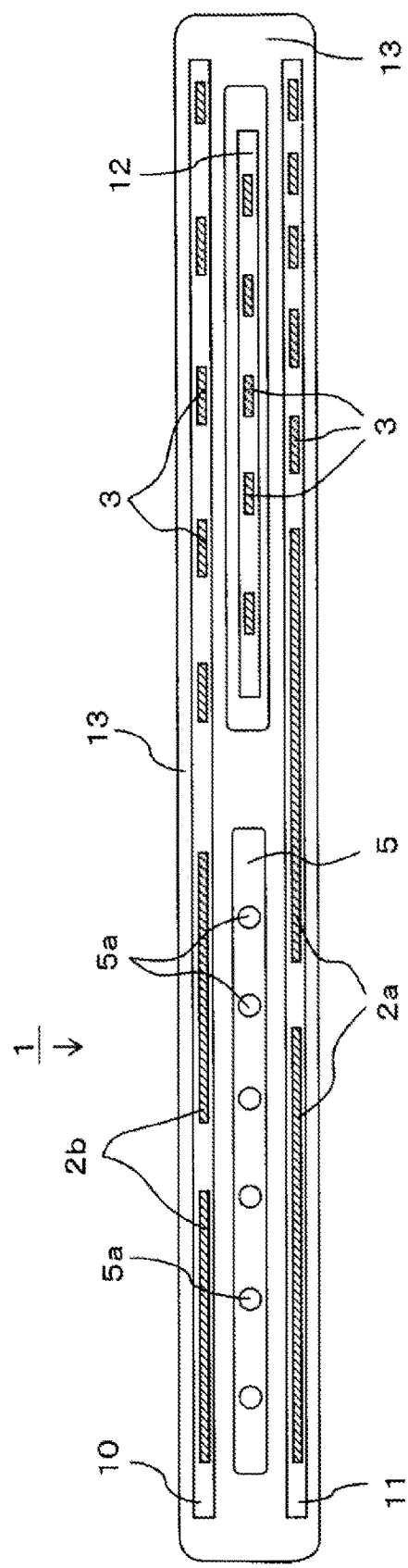
FIG. 2 is an enlarged cross-sectional view taken along line A-A of FIG. 1.

An optical-electrical composite cable 1 according to an embodiment of the present invention will be described with reference to FIGS. 1 to 5. As shown in FIG. 1, the optical-electrical composite cable 1 is wired between a flat display device 40, i.e. slim panel-shaped electrical equipment, and a set top box STB. In the optical-electrical composite cable 1, as shown in FIG. 2, a tape-type optical fiber conductor 5 having six optical fibers 5a arranged in parallel and an intermediate flexible flat cable 12 are sandwiched between a pair of flexible flat cables 10 and 11. A covering member 13 made of a resin is integrally molded on their entirety, including their outer peripheries, so as to integrate the entire optical-electrical composite cable into a thin strip.

The flat display device 40 is a monitor of a so-called wall-mounted television attached to a wall surface. The flat display device 40 uses organic EL display elements to minimize a protrusion amount from the wall surface, and has a thickness of 3 mm or less. The flat display device 40 is made as slim as possible to 3 mm or less, without providing a tuner for receiving video images to be displayed on the flat display device 40, a signal processing circuit for a video signal, a power circuit for driving the flat display device 40, and the like. These circuits including the tuner, the signal processing circuit, the power circuit, and the like are provided in the set top box STB that is disposed several meters away from the flat display device 40 and connected to the flat display device 40 through the optical-electrical composite cable 1.

Thus, relatively low-speed control signals are outputted from the set top box STB to the flat display device 40 through many signal lines 3 disposed in the three flexible flat cables 10, 11, and 12 of the optical-electrical composite cable 1, to control the operation of each circuit element of the flat display device 40. A video signal, which requires large-capacity high-speed transmission, is outputted from the set top box STB to the flat display device 40 through the six optical fibers 5a disposed in the tape-type optical fiber conductor 5 of the optical-electrical composite cable 1.

The flat display device 40 has multiple different power systems, including 24V/240 W for driving a display unit of the flat display device 40, 12V/40 W for driving a control circuit and the like to control the display unit and an encryption circuit HDCP, and the like. In the flat display device 40, to divide a single input power voltage and feed stabilized power from the multiple power systems, a constant-voltage power circuit constituted of IC circuit elements having certain outside thicknesses, such as an operational amplifier, a three-terminal regulator, and the like are required to be provided. However, in this embodiment, the constant-voltage power circuit is contained in the set top box STB, for the purpose of slimming the flat display device 40. Power of different drive sources is fed from the set top box STB to individual circuits of the flat display device 40 through two pairs of first power lines 2a and second power lines 2b, the number of pairs of which corresponds to the number of power systems (two systems here) of the flat display device 40 routed in any of the three flexible flat cables 10, 11, and 12 of the optical-electrical composite cable 1.

Each of the pair of flexible flat cables 10 and 11 and the intermediate flexible flat cable 12 is a flexible flat cable (hereinafter abbreviated as FFC) in which a plurality of straight strip-shaped conductors are secured to and bonded on a slender strip-shaped film base material, but is not limited to the FFC, as long as the flexible flat cable 10, 11, or 12 is a flexible flat wiring board in which a power line and a signal line are disposed in a longitudinal direction of a slender strip-shaped flexible base material. Each of the flexible flat cable 10, 11, and 12 may be a flexible printed circuit (hereinafter abbreviated as FPC) in which a wiring pattern is formed on a surface of an insulating film base material by etching. This embodiment uses the FFCs, due to the advantages that several meters of cables can be manufactured at a relatively low cost, and routing directions of power lines and signal lines can be changed even in narrow connection space without being bulky, as described later. In the following description, the flexible flat cable 10 laminated on the side of a front surface of the tape-type optical fiber conductor 5 is referred to as a front surface-side FFC 10. The flexible flat cable 11 laminated on the side of a rear surface of the tape-type optical fiber conductor 5 is referred to as a rear surface-side FFC 11. The intermediate flexible flat cable 12 is referred to as an intermediate FFC 12.

In each of the FFCs 10, 11, and 12, a plurality of straight strip-shaped conductors made of copper foil are integrally embedded between two slender strip-shaped insulating film base materials made of PET (polyethylene terephthalate) having high mechanical strength, along a longitudinal direction of the insulating film materials, such that the embedded conductors form power lines 2 and signal lines 3 disposed in each of the FFCs 10, 11, and 12. Since the conductors formed in the FFCs 10, 11, and 12 are sufficiently thicker than a conductive pattern of an FPC having a thickness of several tens of micrometers, a power current of a sufficient allowable current can flow through the power lines 2. However, considering the case of setting an allowable current of 10 A or more, the line widths (lateral widths in FIG. 2) of the above-described two pairs of first and second power lines 2a and 2b are sufficiently wider than the line widths of the signal lines 3, and are proportional to the amount of the allowable current.

The two pairs of first and second power lines 2a and 2b and the many signal lines 3 can be disposed in arbitrary positions of each of the FFCs 10, 11, and 12, as long as the power lines 2a and 2b and the signal lines 3 do not interfere with each other. Here, as shown in FIG. 2, the one pair of first power lines 2a are disposed in the rear surface-side FFC 11, while the one pair of second power lines 2b are disposed in the front surface-side FFC 10. The many signal lines 3 are disposed in remaining space of each of the FFCs 10, 11, and 12.

The tape-type optical fiber conductor 5 is a conductor in which the six optical fiber wires 5a are integrated by a resin into a tape shape in a state of being arranged in parallel along a horizontal plane of FIG. 2. Since an optical fiber constituted of a core and a clad is very fragile by itself, an optical fiber wire in which the periphery of the optical fiber is covered with a layer of covering, the tape-type optical fiber conductor 5 in which a plurality of optical fiber wires are horizontally arranged and integrated by a resin into a tape shape, or the like is used. Here, as well as the optical fiber constituted of the core and the clad, the optical fiber wire arranged in the tape-type optical fiber conductor 5 is also referred to as an optical fiber.

The tape-type optical fiber conductor 5 has a flat strip shape having approximately the same thickness as the intermediate FFC 12. The tape-type optical fiber conductor 5 is sandwiched between the front surface-side FFC 10 and the rear surface-side FFC 11 together with the intermediate FFC 12, at a side of the intermediate FFC 12. In this state, the covering member 13 is integrally molded on their entirety, including the outer peripheries of the front surface-side FFC 10 and the rear surface-side FFC 11, so that the optical-electrical composite cable 1 the entirety of which is integrated into a thin strip shape is obtained.

Any resin can be used for the covering member 13, as long as the resin can keep the shape of the optical fiber, and the resin has an adhesive force on the order of not damaging the optical fibers, while preventing the optical fibers from receiving a stress distortion owing to adhesion. Examples of the resin used for the covering member 13 may include various pressure sensitive adhesives (tackiness agents), thermoplastic adhesives, and thermosetting adhesives of an urethane series, an acrylic series, an epoxy series, a nylon series, a phenol series, a polyimide series, a vinyl series, a silicone series, a rubber series, a fluoro epoxy series, a fluoro acrylic series, and the like. For ease of securing the optical fibers, the pressure sensitive adhesives and the thermoplastic adhesives are preferably used.

The covering member 13 may be a molded thin film member, and may be combined with the above-described adhesive. Examples thereof may include an ABS resin, a silicone rubber resin, a modified silicone rubber resin, butyl rubber, acrylic rubber, polyimide, vinyl chloride, a polyester elastomer, and a polyolefin elastomer. The silicone rubber resin and the modified silicone rubber resin, which are synthetic rubbers having flexibility, are preferably used.

The optical fibers and the pair of flexible flat wiring boards can be covered with the covering member 13 so as to integrate the entirety by any method. For example, in the case of the film member, the film member may be wrapped around the outer periphery of the pair of flexible flat wiring boards, or the two film members may be bonded by a pressing machine, a roller, or the like using an adhesive or the like. In the case of using a resin or an adhesive, the resin or the adhesive may be applied to the flexible flat wiring boards or the outer peripheries of the optical fibers, and may be cured in a state that the optical fibers and the flexible flat wiring boards are overlaid. In another method, the flexible flat wiring boards and the optical fibers may be inserted in a mold, and the resin may be charged and cured for molding. Besides, any well-known method can be used, as long as the structure of the optical-electrical composite cable according to the present invention can be achieved.

The lateral width (width in a lateral direction in FIG. 2) of the slender strip-shaped optical-electrical composite cable 1 differs in accordance with the line widths of the power lines 2 and the numbers of the power lines 2 and the signal lines 3, and is, for example, 50 mm. On the other hand, the thickness of each of the front surface-side FFC 10, the tape-type optical fiber conductor 5, and the rear surface-side FFC 11, which are laminated in three layers, can be set at 0.5 mm or less each, so that the thickness of the optical-electrical composite cable 1 covered with the covering member 13 is 2 mm or less.

As described above, the optical-electrical composite cable 1 is bendable in a flat thickness direction having a thickness of 2 mm or less. However, since the front surface-side FFC 10 and the rear surface-side FFC 11 are integrally disposed on both sides of the tape-type optical fiber conductor 5 in a bending direction, the optical-electrical composite cable 1 is not distorted in any direction with a large curvature, so that each of the optical fibers 5a of the tape-type optical fiber conductor 5 is not damaged or deformed.

Since the set top box STB has no limitations on a connection position and the size of a connection portion, an optical-electrical composite plug 30 on which terminals of the power lines 2, the signal lines 3, and the optical fibers 5a face is attached to a terminal of the optical-electrical composite cable 1 on the side of the set top box STB. The optical-electrical composite plug 30 is fit-connected to a receptacle 32 mounted on a printed circuit board 31 of the set top box STB, so that the two pair of power lines 2 and the many signal lines 3 are electrically connected to corresponding circuits of the set top box STB.

Figure 5:
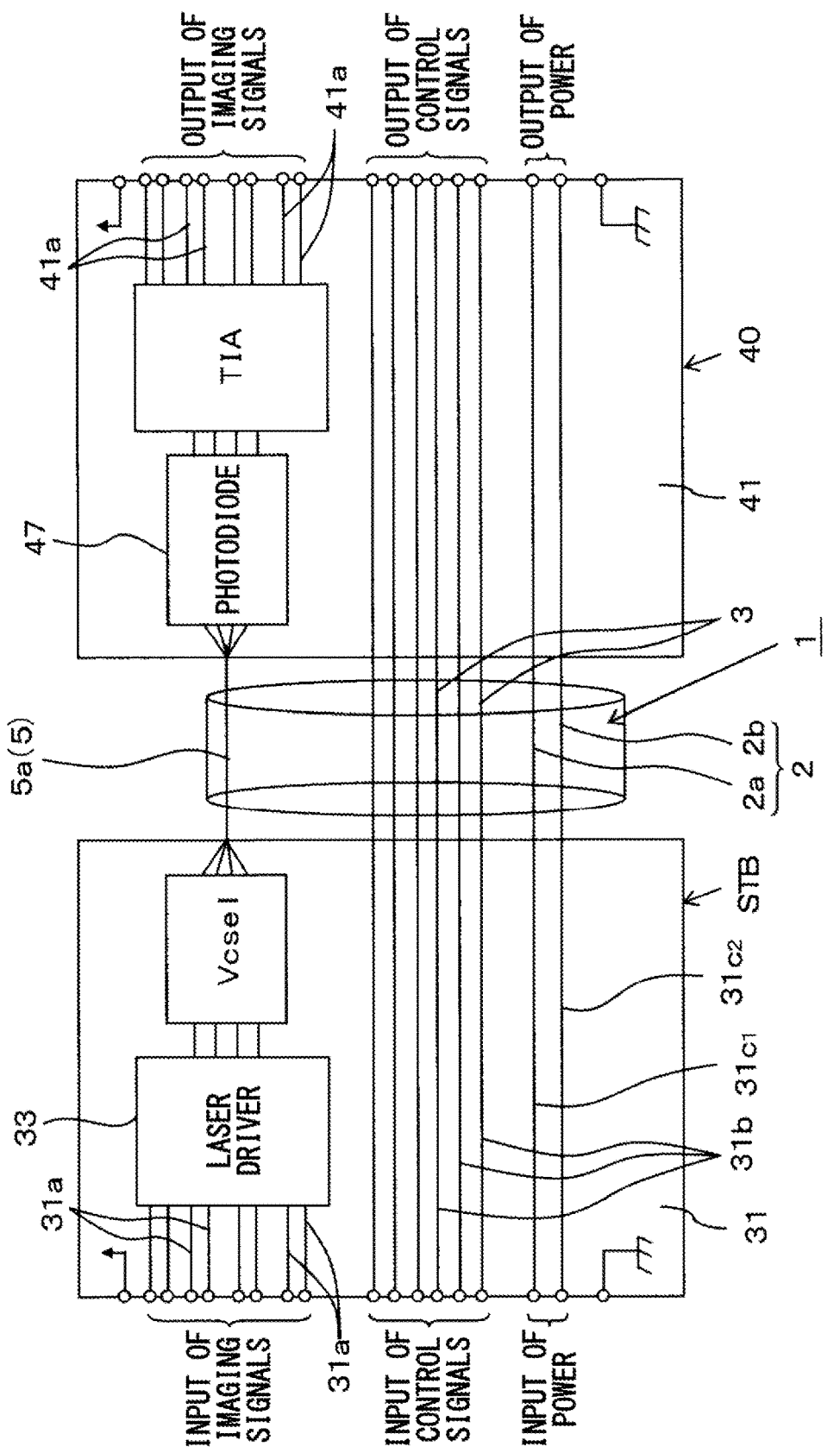
FIG. 5 is a block diagram of FIG. 1.

As shown in FIG. 5, the receptacle 32 contains a surface emitting laser Vcsel controlled by a laser driver 33. The surface emitting laser Vcsel applies an E-O conversion to a signal inputted to the laser driver 33, and emits a laser beam to the optical fibers 5a facing the optical-electrical composite plug 30. As shown in FIG. 5, a signal inputted to six-lane high-speed signal traces 31a of the set top box STB is a video signal transmitted at a transmission speed of 12 Gbps per lane. The surface emitting laser Vcsel sends an optical signal that is converted from the video signal by the E-O conversion, to the six optical fibers 5a corresponding to the six lanes.

Signals inputted to the many low-speed signal traces 31b of the set top box STB are, for example, control signals having a transmission speed of several tens of Mbps to control the operation of the encryption circuit HDCP and the organic EL display elements of the flat display device 40. The control signals are outputted to the flat display device 40 through the signal lines 3 connected to the low-speed signal traces 31b.

Furthermore, in the printed circuit board 31 of the set top box STB, correspondingly to the two power systems of the flat display device 40, a first power supply trace 31c1 and a second power supply trace 31c2 are formed. The first power supply trace 31c1 feeds driving power of 24V/240 W to the display unit of the flat display device 40 through the first power lines 2a of the optical-electrical composite cable 1, and the second power supply trace 31c2 feeds driving power of 12V/40 W to the control circuit and the like of the flat display device 40 through the second power lines 2b of the optical-electrical composite cable 1. Therefore, it is possible to eliminate the need for providing a constant-voltage power circuit, for supplying stable power from a plurality of different power systems, in the flat display device 40, thus allowing slimming the flat display device 40 to the order of 3 mm in thickness.

The flat display device 40 connected to the other end of the optical-electrical composite cable 1 has a limitation of being connected to the optical-electrical composite cable 1 at its side surface having a thickness of 3 mm, without increasing a protrusion amount from the wall surface owing to the connection to the optical-electrical composite cable 1. As described above, the optical-electrical composite cable 1 has a width of 50 mm and a thickness of 2 mm or less. The optical-electrical composite cable 1 is thin enough that a terminal portion of the optical-electrical composite cable 1 is inserted into a connection slot 48 of the flat display device 40 having the side surface having a width of 3 mm, to establish connection with the flat display device 40.

Since the terminal portion of the optical-electrical composite cable 1 on the side of the flat display device 40 is not covered with the covering member 13, the cables of the front surface-side FFC 10, the tape-type optical fiber conductor 5, the intermediate FFC 12, and rear surface-side FFC 11, which are laminated in layers, are not integrated but can be individually and independently separated. In this embodiment, as shown in FIG. 1, in order to prevent bending of the optical fibers 5a of the tape-type optical fiber conductor 5 and interference of the power lines 2 and the signal lines 3 with the terminal portion of the tape-type optical fiber conductor 5, three of the front surface-side FFC 10, the intermediate FFC 12, and the rear surface-side FFC 11 are folded back by 180 degrees along an inclination line of 45 degrees so as to be turned upside down, and are drawn upward orthogonally to the optical fibers 5a in the connection slot 48. Since the front surface-side FFC 10, the intermediate FFC 12, and the rear surface-side FFC 11 can be folded back by 180 degrees without almost being bulky, the front surface-side FFC 10, the intermediate FFC 12, and the rear surface-side FFC 11 can be sufficiently folded back even in the connection slot 48 having a width of 3 mm or less. However, when the folded front surface-side FFC 10, intermediate FFC 12, and rear surface-side FFC 11 exceed the width of the connection slot 48, the front surface-side FFC 10, the intermediate FFC 12, and the rear surface-side FFC 11 may be folded back at different positions along a routing direction of the tape-type optical fiber conductor 5.

In FIG. 1, three of the front surface-side FFC 10, the intermediate FFC 12, and the rear surface-side FFC 11 folded upward with respect to the routing direction of the tape-type optical fiber conductor 5 are folded back again by 180 degrees along an inclination line of 45 degrees at different positions in a sequential manner from above so as to be turned upside down. Therefore, the front surface-side FFC 10, the intermediate FFC 12, the rear surface-side FFC 11, and the tape-type optical fiber conductor 5 are drawn out in this order from above in parallel with each other to a printed circuit board 41 of the flat display device 40. Therefore, as shown in FIG. 1, the cables can be connected to FFC connectors 42A, 42B, and 42C and a receptacle 43 mounted in different positions of the printed circuit board 41, at their terminals.

Figure 3:
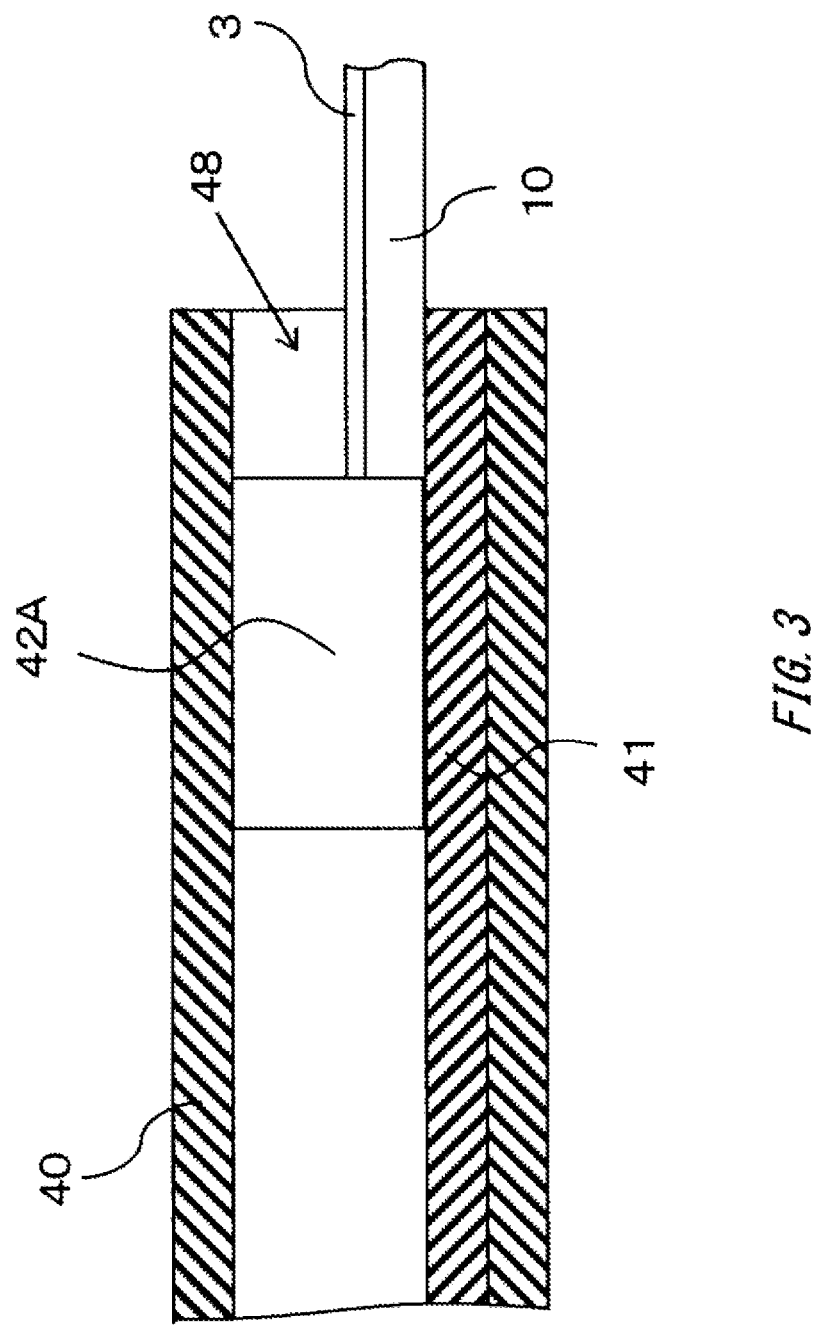
FIG. 3 is an enlarged cross-sectional view showing a connection portion between a front surface-side flexible flat cable 10 and the flat display device 40.

The terminals of the front surface-side FFC 10 having the second power lines 2b and the many signal lines 3 are connected to the FFC connector 42A mounted on the printed circuit board 41, as shown in FIG. 3. Accordingly, power of 12V/40 W is fed from the second power lines 2b to the display unit, the control circuit for controlling the encryption circuit HDCP, and the like of the flat display device 40, while control signals to control the individual circuit elements of the flat display device 40 are outputted from the many signal lines 3 at a relatively low transmission speed. Since the printed circuit board 41 has a thickness of 0.5 mm and the FFC connector 42A has a thickness of 1.2 mm, the front surface-side FFC 10 of the optical-electrical composite cable 1 can be connected in the connection slot 48 of the flat display device 40 having a width of 3 mm.

In the same manner, the terminals of the intermediate FFC 12 having the many signal lines 3 and the terminals of the rear surface-side FFC 11 having the first power lines 2a and the many power lines 3 are connected to the FFC connectors 42B and 42C mounted on the printed circuit board 41, respectively. Accordingly, power of 24V/240 W is fed from the first power lines 2a to the display unit of the flat display device 40, while control signals to control the individual circuit elements of the flat display device 40 are outputted from the many signal lines 3 at a relatively low transmission speed.

An optical plug 44 is attached to terminal portions of the six optical fibers 5a of the tape-type optical fiber conductor 5, in order to secure each optical fiber 5a and establish fitting connection with the receptacle 43 mounted on the printed circuit board 41. The height of the receptacle 43 fitted and connected to the optical plug 44 is 1.7 mm at the maximum, including the printed circuit board 41 having a thickness of 0.5 mm, so that the optical plug 44 can be connected to the side surface of the flat display device 40 having a width of 3 mm.

Figure 4:
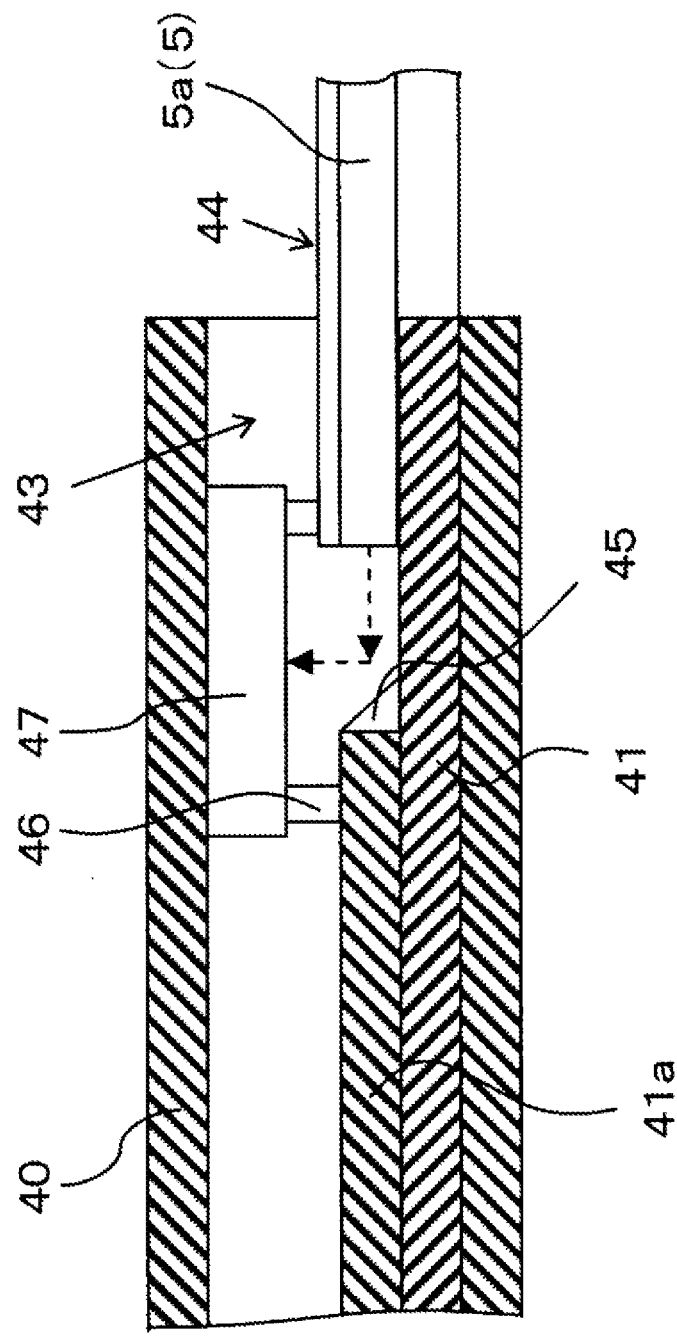
FIG. 4 is an enlarged cross-sectional view showing a connection portion between a tape-type optical fiber conductor 5 and the flat display device 40.

As shown in FIG. 4, the receptacle 43 contains a 45-degree mirror 45 that is disposed opposite each of end surfaces of the six optical fibers 5a so as to convert an optical axis of each optical fiber 5a in a horizontal direction in the drawing into a vertical direction, and a photodiode 47 mounted on the high-speed signal traces 41a of the printed circuit board 41 with gold bumps 46 such that its light receiving surface faces the 45-degree mirror 45. The photodiode 47 applies a photoelectrical conversion to an optical signal, which represents a video signal, emitted from the end surfaces of the six optical fibers 5a at a transmission speed of 12 Gbps, and outputs the converted signal to a trans-impedance amplifier TIA connected on an output side.

The trans-impedance amplifier TIA converts a weak current signal representing the video signal outputted from the photodiode 47 into a voltage signal, and outputs the voltage signal to an organic EL driver for controlling display on the display unit of the flat display device 40 through six-lane high-speed signal traces 41a corresponding to the six optical fibers 5a. Therefore, video images are generated from the video signal transmitted from the set top box STB at a transmission speed of 12 Gbps per lane, and displayed on the display unit.

According to this embodiment, the optical-electrical composite cable 1 to establish connection between the set top box STB and the flat display device 40, i.e. the slim panel-shaped electrical equipment, is formed into a thin strip shape in which the intermediate FFC 12 and the tape-type optical fiber conductor 5 are just sandwiched between the front surface-side FFC 10 and the rear surface-side FFC 11. Therefore, the optical-electrical composite cable 1 can be connected to the slim panel-shaped flat display device 40, and bent to a degree of not damaging the optical fibers 5a of the tape-type optical fiber conductor 5, thus allowing flexibility in wiring.

In the optical-electrical composite cable 1 according to this embodiment, the lateral widths (widths in a lateral direction in FIG. 2) of the front surface-side FFC 10 and the rear surface-side FFC 11 are longer than the lateral width of the tape-type optical fiber conductor 5 sandwiched between the front surface-side FFC 10 and the rear surface-side FFC 11. Taking advantage of side space of the tape-type optical fiber conductor 5 sandwiched between the front surface-side FFC 10 and the rear surface-side FFC 11, the intermediate FFC 12 is disposed. However, the intermediate FFC 12 is not necessarily provided, if the numbers of the power lines 2 and the signal lines 3 to be disposed in the flexible flat wiring board are small.

Figure 6:
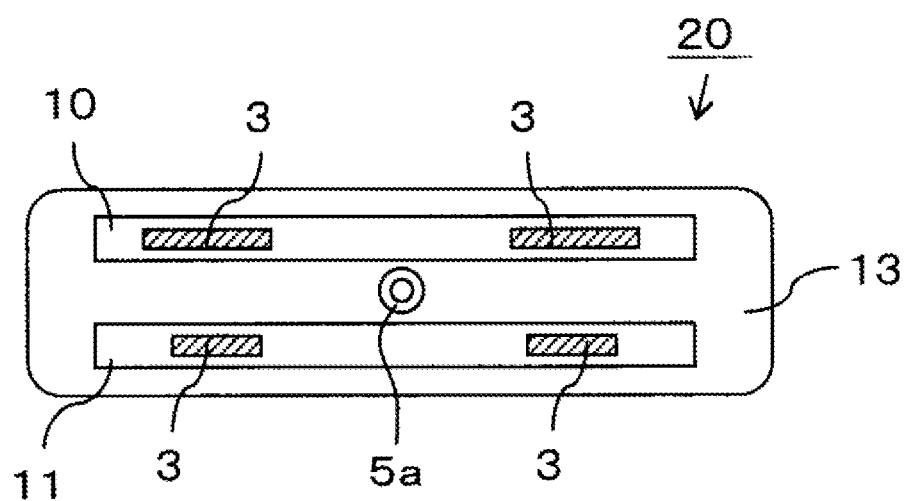
FIG. 6 is an enlarged sectional view of an optical-electrical composite cable 20 according to another embodiment, taken in a position corresponding to line A-A of FIG. 1.
Figure 7:
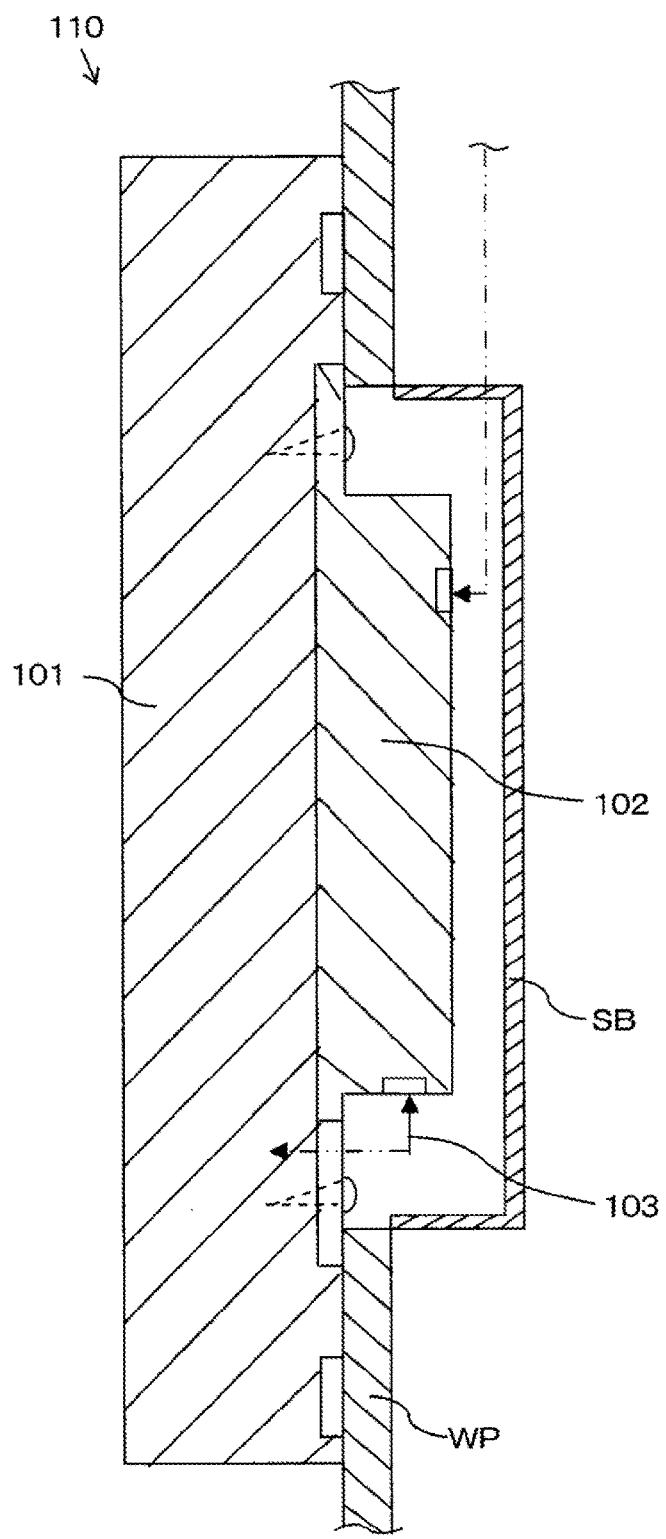
FIG. 7 is a longitudinal sectional view of a related power line 103 to connect between a display device 101 and an additional device 102.
Figure 8:
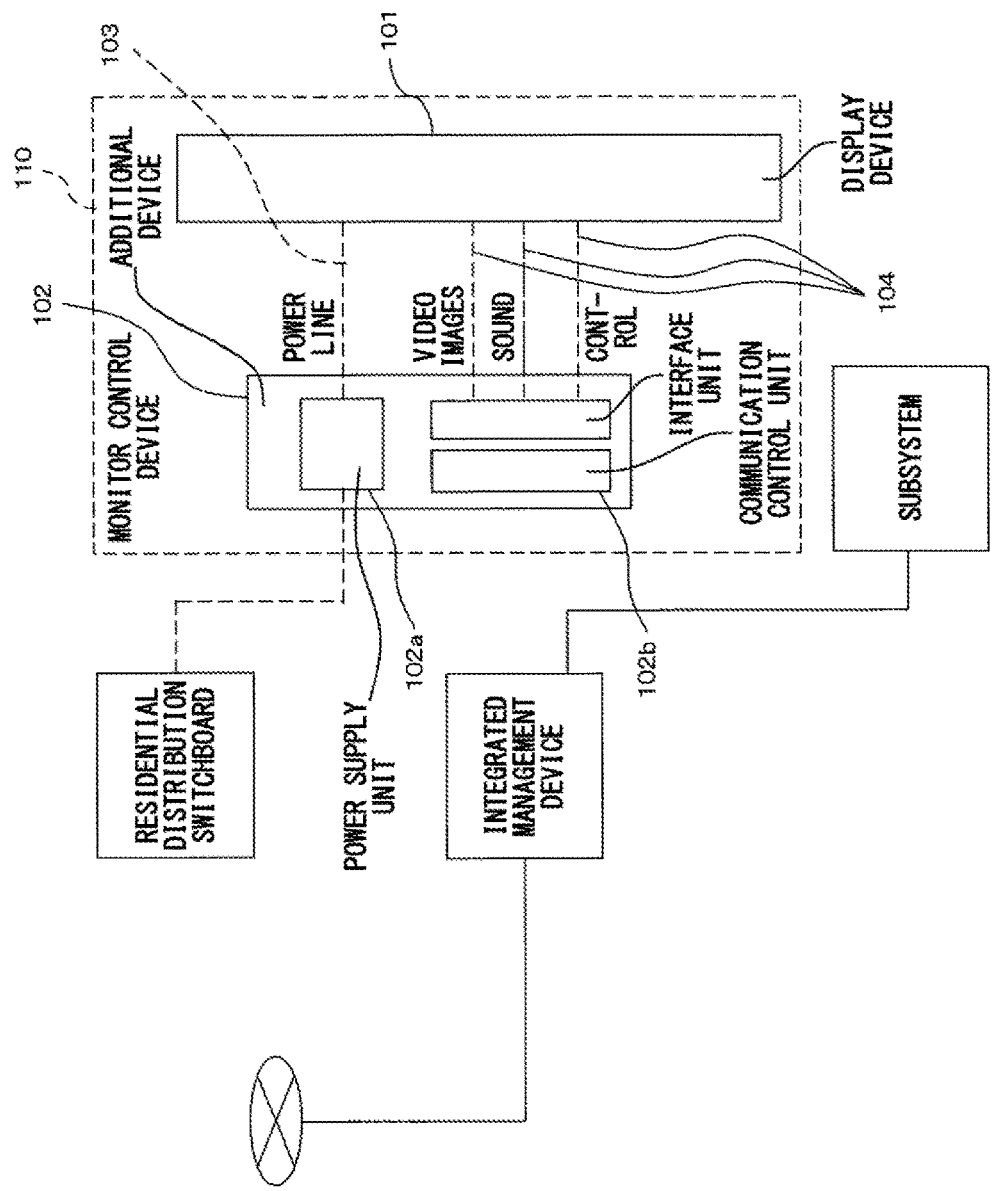
FIG. 8 is a block diagram of a wall-mounted television 110.
Figure 9A:
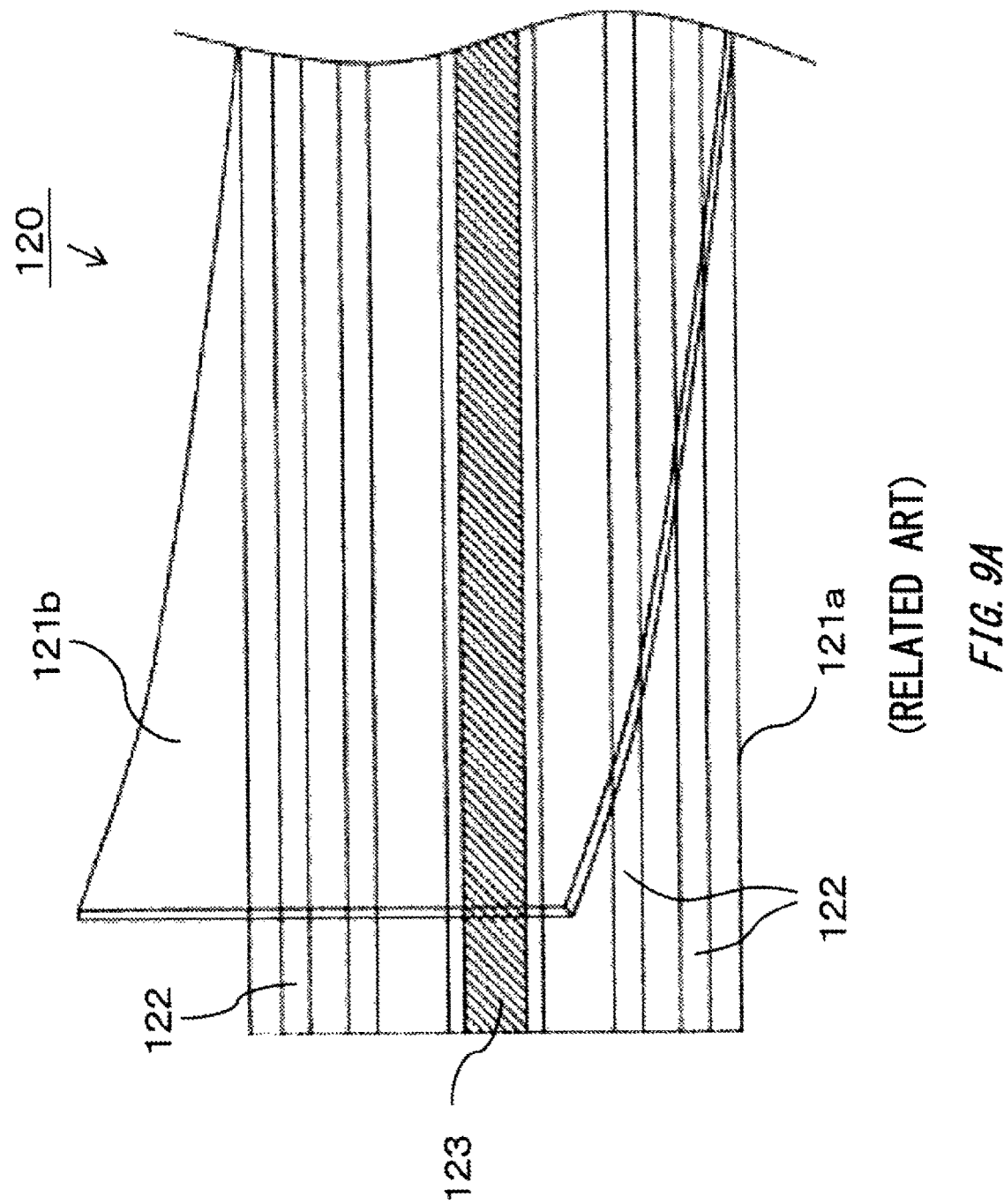
FIG. 9A is a plan view showing a state that a thin insulating protective sheet 121b is partly peeled from a surface of a related optical-electrical composite cable 120.
Figure 9B:
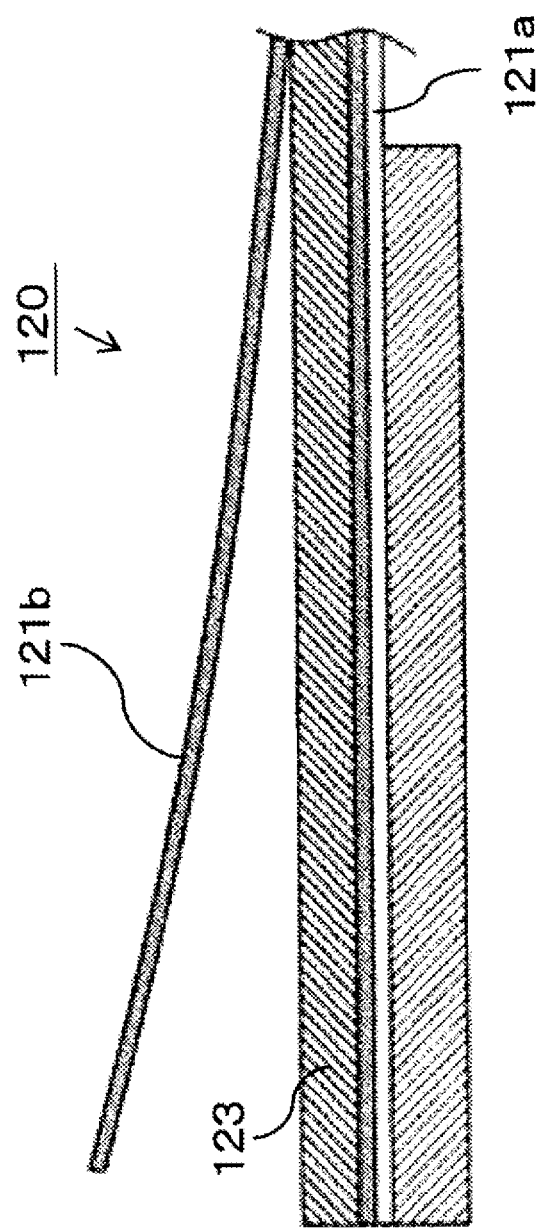
FIG. 9B is a longitudinal cross-sectional view taken along a longitudinal direction, showing the state that the thin insulating protective sheet 121b is partly peeled from the surface of the optical-electrical composite cable 120.
Figure 10A:
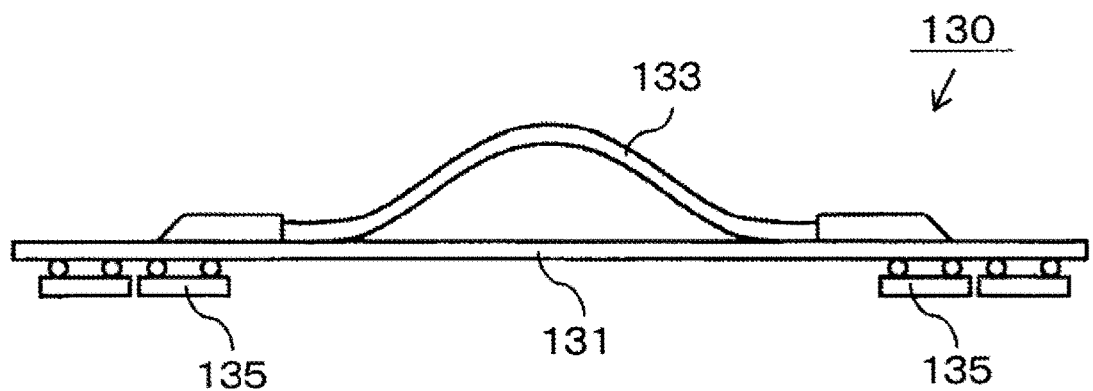
FIG. 10A is a side view of a related optical-electrical composite cable 130.
Figure 10B:
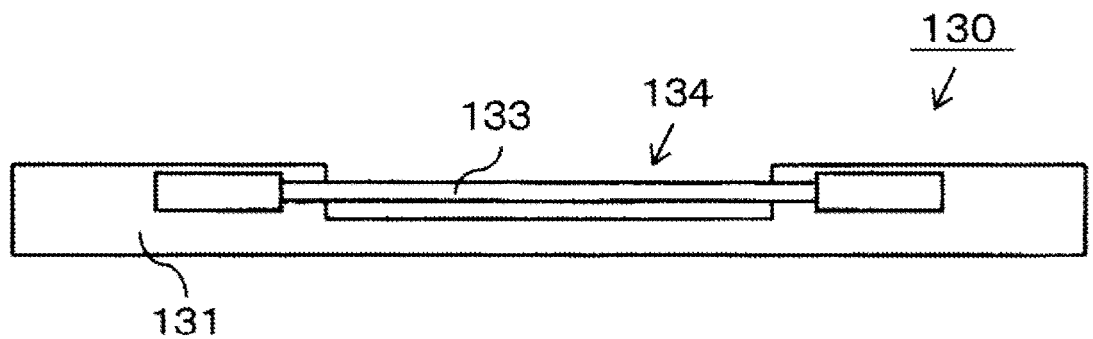
FIG. 10B is a plan view of the optical-electrical composite cable 130.

FIG. 6 shows an optical-electrical composite cable 20 according to another embodiment of the present invention, without having the intermediate FFC 12. In the drawing, the same reference numerals as those of the optical-electrical composite cable 1 indicate the same or similar functioning components, and a detailed description thereof is omitted. In the optical-electrical composite cable 20, a single optical fiber 5a is sandwiched between a front surface-side FFC 10 and a rear surface-side FFC 11 each of which has a plurality of signal lines 3. A covering member 13 made of resin integrates the entirety of the optical-electrical composite cable 20 into a flat outside shape.

According to the optical-electrical composite cable 20, the lateral widths of the front surface-side FFC 10 and the rear surface-side FFC 11 are reduced, thus allowing a reduction in the lateral width of the entire optical-electrical composite cable 20.

The above-described embodiment takes the flat display device having a thickness of 3 mm as an example of the slim panel-shaped electrical equipment. However, the slim panel-shaped electrical equipment is not limited to the display device, as long as it has the shape of a slim panel.

The cable in which the tape-type optical fiber conductor 5 is combined into the flexible flat wiring board having the power lines 2 and the signal lines 3 is taken as an example the optical-electrical composite cable 1, but as in the case of the optical-electrical composite cable 20, only the optical fiber 5a may be combined into the flexible flat wiring board having the signal lines 3. Furthermore, the tape-type optical fiber conductor 5 may be an active optical cable in which an O-E conversion element and an E-O conversion element are integrally connected to both ends of each optical fiber 5a into a module. The number of the optical fibers 5*a* arranged in the tape-type optical fiber conductor 5 in parallel is not limited to a plurality but may be a single.

The optical fiber that is integrated by the resin covering member between the pair of front surface-side and rear surface-side flexible flat wiring boards is not limited to the tape-type optical fiber conductor having the cover, but may be an optical fiber wire including only a core and a clad.

Furthermore, the numbers and shapes of the power lines 2, the signal lines 3, and the optical fibers 5*a* combined into the optical-electrical composite cable 1 are not limited to the above-described embodiments. In particular, the number of the power lines 2 is set in accordance with the number of power systems in slim panel-shaped electrical equipment, and the line width of each power line is set in accordance with an allowable current that is equal to or more than a maximum current of power fed through the power line.

Furthermore, in the above-described embodiment, the covering member 13 is integrally molded on the tape-type optical fiber conductor 5 and the pair of the front surface-side FFC 10 and the rear surface-side FFC 11 disposed on the front and rear of the tape-type optical fiber conductor 5, to integrate the entirety. However, an adhesive layer or an insulating tape having the adhesive layer that tightly adhere to the outer peripheries of the pair of the front surface-side FFC 10 and the rear surface-side FFC 11 may be used as the covering member 13. The insulating tape may be wrapped around the outer peripheries of the pair of the front surface-side FFC 10 and the rear surface-side FFC 11 disposed on the front surface side and the rear surface side of the optical fiber 5*a*, so as to integrate the entirety of the pair of the front surface-side FFC 10 and the rear surface-side FFC 11 that sandwich the optical fiber 5*a*.

The embodiment of the present invention is suited for an optical-electrical composite cable that is electrically connected to slim panel-shaped electrical equipment, and outputs a large high-speed signal to the electrical equipment through an optical fiber, as well as outputs a relatively low-speed signal to the electrical equipment through a signal line made of a conductor.

REFERENCE SIGNS LIST

1 optical-electrical composite cable
2 power line
2*a* first power line
2*b* second power line
3 signal line
5 tape-type optical fiber conductor
5*a* optical fiber
10 front surface-side flexible flat cable (front surface-side FFC)
11 rear surface-side flexible flat cable (rear surface-side FFC)
12 intermediate flexible flat cable (intermediate FFC)
13 covering member
40 slim panel-shaped electrical equipment (flat display device)

The invention claimed is:

1. An optical-electrical composite cable configured to be connected to a slim panel-shaped electrical equipment, wherein flexible flat wiring boards having signal lines to output electrical signals to the slim panel-shaped electrical equipment and an optical fiber to output an optical signal to be converted into a high-speed electrical signal to the slim panel-shaped electrical equipment are combined, the optical-electrical composite cable comprising:
   the optical fiber;
   at least one pair of the flexible flat wiring boards in which flat wiring boards composed of flexible flat cables having a plurality of straight strip-shaped conductors secured along a slender strip-shaped film base material or flexible printed circuits having a power line and a signal line routed in a longitudinal direction of a slender strip-shaped flexible base material are laminated along the optical fiber on a front surface side and a rear surface side of the optical fiber;
   an intermediate flexible flat wiring board that is disposed at a side of the optical fiber sandwiched between the pair of flexible flat wiring boards disposed on the front surface side and the rear surface side; and
   a covering member configured to integrate an entirety of the pair of flexible flat wiring boards, the optical fiber, and the intermediate flexible flat wiring board.

2. The optical-electrical composite cable according to claim 1, wherein the covering member tightly adheres to outer peripheries of the pair of flexible flat wiring boards, and the covering member integrates the entirety of the pair of flexible flat wiring boards sandwiching the optical fiber and the intermediate flexible flat wiring board.

3. The optical-electrical composite cable according to claim 1, wherein each of the pair of flexible flat wiring boards is a flexible flat cable.

4. The optical-electrical composite cable according to claim 1, comprising a power line for feeding driving power to drive the slim panel-shaped electrical equipment, the power line being disposed in at least any of the pair of flexible flat wiring boards.

5. The optical-electrical composite cable according to claim 1, wherein the covering member is made of a synthetic rubber.

* * * * *